United States Patent
Hu

(10) Patent No.: US 9,630,701 B2
(45) Date of Patent: Apr. 25, 2017

(54) DIRECT WRITING BUS BARS FOR SCREEN PRINTED RESIN-BASED CONDUCTIVE INKS

(71) Applicant: Goodrich Corporation, Charlotte, NC (US)

(72) Inventor: Jin Hu, Hudson, OH (US)

(73) Assignee: Goodrich Corporation, Charlotte, NC (US)

( * ) Notice: Subject to any disclaimer, the term of this patent is extended or adjusted under 35 U.S.C. 154(b) by 369 days.

(21) Appl. No.: 14/191,873

(22) Filed: Feb. 27, 2014

(65) Prior Publication Data

US 2015/0053664 A1   Feb. 26, 2015

Related U.S. Application Data

(60) Provisional application No. 61/891,292, filed on Oct. 15, 2013, provisional application No. 61/891,276, (Continued)

(51) Int. Cl.
*H05B 1/00* (2006.01)
*B64C 1/18* (2006.01)
(Continued)

(52) U.S. Cl.
CPC ............ *B64C 1/18* (2013.01); *B64D 13/00* (2013.01); *F24D 13/024* (2013.01); *H05B 3/16* (2013.01);
(Continued)

(58) Field of Classification Search
CPC .... B64C 1/18; B64C 1/40; B64C 1/00; B64D 13/00; B64D 13/08; H05K 3/1216;
(Continued)

(56) References Cited

U.S. PATENT DOCUMENTS 2,021,491 A     11/1935  Ruben
3,697,728 A  *  10/1972  Stirzenbecher ........... B64C 1/18
                                                                    219/213
(Continued)

FOREIGN PATENT DOCUMENTS

DE            3919974 A1   12/1989
DE      102011084303 A1    4/2013
(Continued)

OTHER PUBLICATIONS

Extended European Search Report dated Feb. 9, 2016, issued during the prosecution of corresponding European Patent Application No. 14189058.2.
(Continued)

*Primary Examiner* — Shawntina Fuqua
(74) *Attorney, Agent, or Firm* — Locke Lord LLP; Scott D. Wofsy; Alicia J. Carroll

(57) ABSTRACT

A method for providing an electrical connection for conductive ink includes direct writing a bus bar onto areas of a desired electrical connection of the conductive ink. The conductive ink is screen printed onto a dielectric film to create a conductive circuit. An aircraft heated floor panel includes at least one floor panel of an aircraft. The one floor panel includes a conductive circuit having a conductive ink including a bus bar directly written onto areas of a desired electrical connection of the conductive ink. The conductive ink is screen printed onto a dielectric film to create a conductive circuit.

13 Claims, 3 Drawing Sheets

Related U.S. Application Data filed on Oct. 15, 2013, provisional application No. 61/868,372, filed on Aug. 21, 2013.

(51) Int. Cl.

| | | |
|---|---|---|
| *B64D 13/00* | (2006.01) | |
| *F24D 13/02* | (2006.01) | |
| *H05B 3/16* | (2006.01) | |
| *H05K 3/38* | (2006.01) | |
| *H05B 3/26* | (2006.01) | |
| *H05K 3/12* | (2006.01) | |
| *H05K 1/16* | (2006.01) | |

(52) U.S. Cl.
CPC ............ *H05B 3/26* (2013.01); *H05K 3/1283* (2013.01); *H05K 3/38* (2013.01); *F24D 2200/08* (2013.01); *F24D 2220/2081* (2013.01); *H05B 2203/003* (2013.01); *H05B 2203/013* (2013.01); *H05B 2203/017* (2013.01); *H05K 1/167* (2013.01); *H05K 3/1216* (2013.01); *H05K 2201/09263* (2013.01); *Y02B 30/26* (2013.01); *Y10T 29/49155* (2015.01); *Y10T 29/49162* (2015.01)

(58) Field of Classification Search
CPC .......... H05K 3/1283; H05K 3/38; H05K 3/16; H05K 3/22; H05K 3/146; H05K 3/00; H05K 2203/003; H05K 2203/013; H05K 2203/017; H05K 2203/12; H05K 2203/026; H05K 1/167; H05K 2201/09236; Y10T 29/49155; Y10T 29/49162; F24D 2200/08; F24D 2200/2081; F24D 19/1096; Y02B 30/26

See application file for complete search history.

(56) References Cited

U.S. PATENT DOCUMENTS

| | | |
|---|---|---|
| 4,606,116 A | 8/1986 | Hennings et al. |
| 4,864,482 A | 9/1989 | Quazi et al. |
| 6,297,979 B1 | 10/2001 | Tse |
| 7,266,000 B2 | 9/2007 | Terdan |
| 7,556,221 B2 | 7/2009 | Hindel et al. |
| 7,557,330 B2 | 7/2009 | Shearer |
| 7,763,833 B2 | 7/2010 | Hindel et al. |
| 8,071,888 B2 | 12/2011 | Shiraishi et al. |
| 2010/0065686 A1 | 3/2010 | Tauscher et al. |
| 2015/0201491 A1* | 7/2015 | Tatsuta ................... H05K 3/125 361/748 |

FOREIGN PATENT DOCUMENTS

| | | |
|---|---|---|
| EP | 0065419 A1 | 11/1982 |
| EP | 0347824 A2 | 12/1989 |
| EP | 2113456 A2 | 11/2009 |
| EP | 2258143 B1 | 12/2010 |
| WO | WO-91/09511 A2 | 6/1991 |
| WO | WO-03/001849 A2 | 1/2003 |
| WO | WO-2011/151516 A2 | 12/2011 |

OTHER PUBLICATIONS

Pique A, et al., "Embedding electronic circuits by laser direct-write", Microelectronic Engineering, vol. 83, No. 11-12, Nov. 1, 2006, pp. 2527-2533.

Extended European Search Report dated Feb. 9, 2016, issued during the prosecution of European Patent Application No. 14188982.4, 9 pages.

\* cited by examiner

DIRECT WRITING BUS BARS FOR SCREEN PRINTED RESIN-BASED CONDUCTIVE INKS

CROSS-REFERENCE TO RELATED APPLICATIONS

This application claims priority to U.S. Provisional Patent Application No. 61/868,372, filed Aug. 21, 2013, to U.S. Provisional Patent Application No. 61/891,276 filed Oct. 15, 2013, and to U.S. Provisional Patent Application No. 61/891,292 filed Oct. 15, 2013, all of which are incorporated by reference herein in their entirety.

BACKGROUND OF THE INVENTION

1. Field of the Invention

The present disclosure relates to heating circuits, and more particularly to screen printed resin-based conductive ink circuits.

2. Description of Related Art

Resin-based conductive ink can be screen printed in a variety of circuit configurations, for example for resistive heater circuits. One challenge with traditional screen printed resin-based conductive ink circuits is that resin-based conductive ink cannot directly solder for a wire connection. In traditional screen printed resin-based conductive ink circuits, metal and/or alloy bus bars, e.g. copper bus bars, are bonded to the screen printed resin-based conductive ink by using conductive adhesive for subsequent soldering to a wire connection.

In traditional screen printed resin-based conductive ink circuits where bus bars are attached with conductive adhesives, subsequent curing of the adhesive is required. This curing requires specialized surface treatments and adhesive handling. The robustness of bus bar attachments can be compromised if the manufacture workers are not experienced in such treatments or adhesive handling.

Such conventional methods and systems have generally been considered satisfactory for their intended purpose. However, there is still a need in the art for systems and methods that allow for improved adhesion of bus bars to screen printed resin-based conductive inks. The present disclosure provides a solution for these problems.

SUMMARY OF THE INVENTION

A method for providing an electrical connection for conductive ink includes direct writing a bus bar onto areas of a desired electrical connection of the conductive ink. The conductive ink is screen printed onto a dielectric film to create a conductive circuit.

In certain embodiments, the step of direct writing can further include forming a conformal layer of a bus bar on the conductive ink. The conductive ink can include silver particles in an epoxy resin on a dielectric film. Further, the method can include soldering a wire to the bus bar to electrically connect the wire to the conductive ink. In addition, the method can include applying the conductive circuit to at least one panel skin of an aircraft floor panel. The bus bar can be a metal, e.g. copper, bus bar, and/or and alloy bus bar.

In accordance with certain embodiments, an aircraft heated floor panel includes at least one floor panel of an aircraft. The one floor panel includes a conductive circuit having a conductive ink including a bus bar directly written onto areas of a desired electrical connection for the conductive ink. The conductive ink is screen printed onto a dielectric film to create a conductive circuit.

It is also contemplated that a wire can be soldered onto the bus bar to electrically connect the wire and the conductive circuit. Also, the conductive ink can include silver particles in an epoxy resin on a dielectric film.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
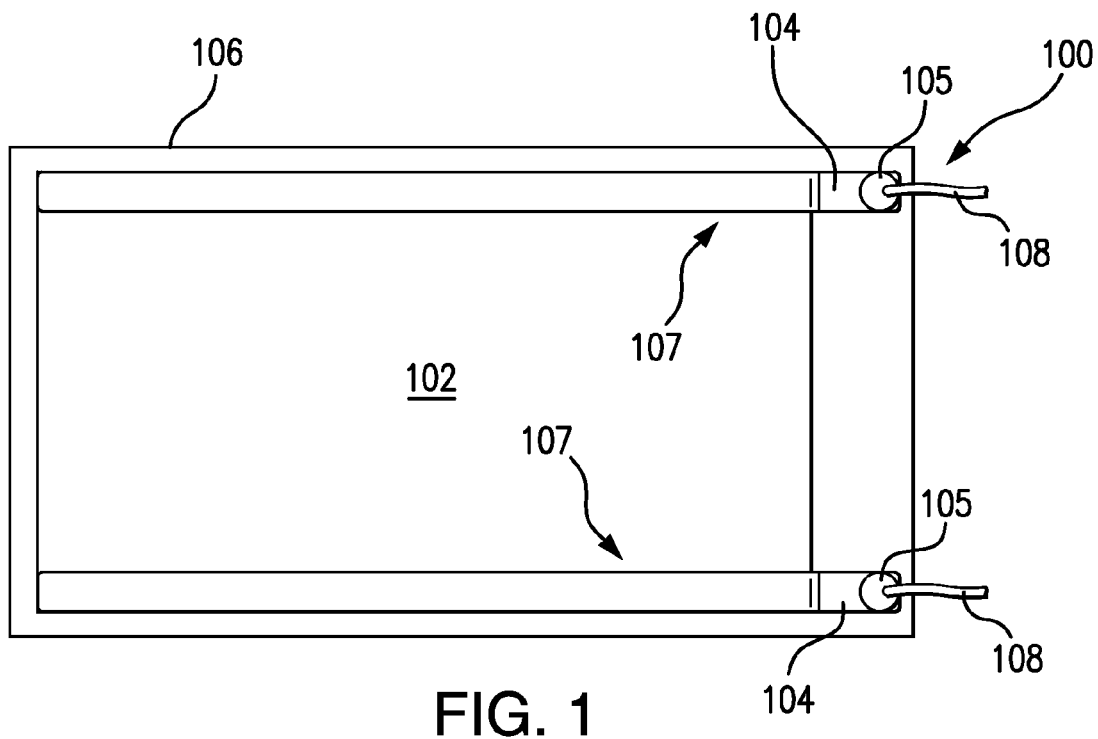
FIG. 1 is a top plan view of an exemplary embodiment of a screen printed conductive ink circuit constructed in accordance with the present disclosure, schematically showing the bus bar, conductive ink, and soldered wire connection.

Reference will now be made to the drawings wherein like reference numerals identify similar structural features or aspects of the subject disclosure. For purposes of explanation and illustration, and not limitation, an exemplary embodiment of a conductive ink circuit with a bus bar constructed in accordance with the disclosure is shown schematically in FIG. 1 and is designated generally by reference character 100. Other embodiments of conductive ink circuits with a bus bar in accordance with the disclosure, or aspects thereof, are provided schematically in FIGS. 2-5, as will be described. The systems and methods described herein can be used to bond bus bars, e.g. copper bus bars, by direct writing copper buses on wire connection areas of screen printed conductive ink circuits.

Figure 2:
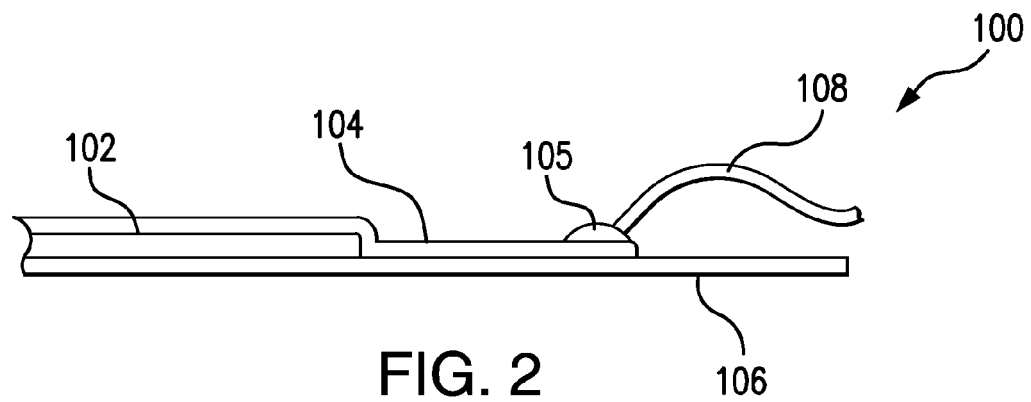
FIG. 2 is a partial side elevation view of the screen printed conductive ink circuit of FIG. 1, schematically showing the bus bar, conductive ink and soldered wire connection.

As shown schematically in FIGS. 1 and 2, a conductive ink circuit 100 includes conductive ink 102 and bus bars 104, e.g. copper bus bars. Conductive ink 102 is screen printed in a pattern onto a dielectric film 106 to create conductive ink circuit 100, wherein the conductive ink 102 forms an electrical resistive heating element. For example, conductive ink 102 can have perforations, or any other suitable pattern. Each copper bus bar 104 is connected to a respective wire 108 by solder 105. Copper bus bars 104 electrically connect their respective wires 108 to conductive ink 102. While described herein as copper bus bars 104, those skilled in the art will readily appreciate that bus bars 104 can be made from a variety of metals and/or alloys.

Figure 3:
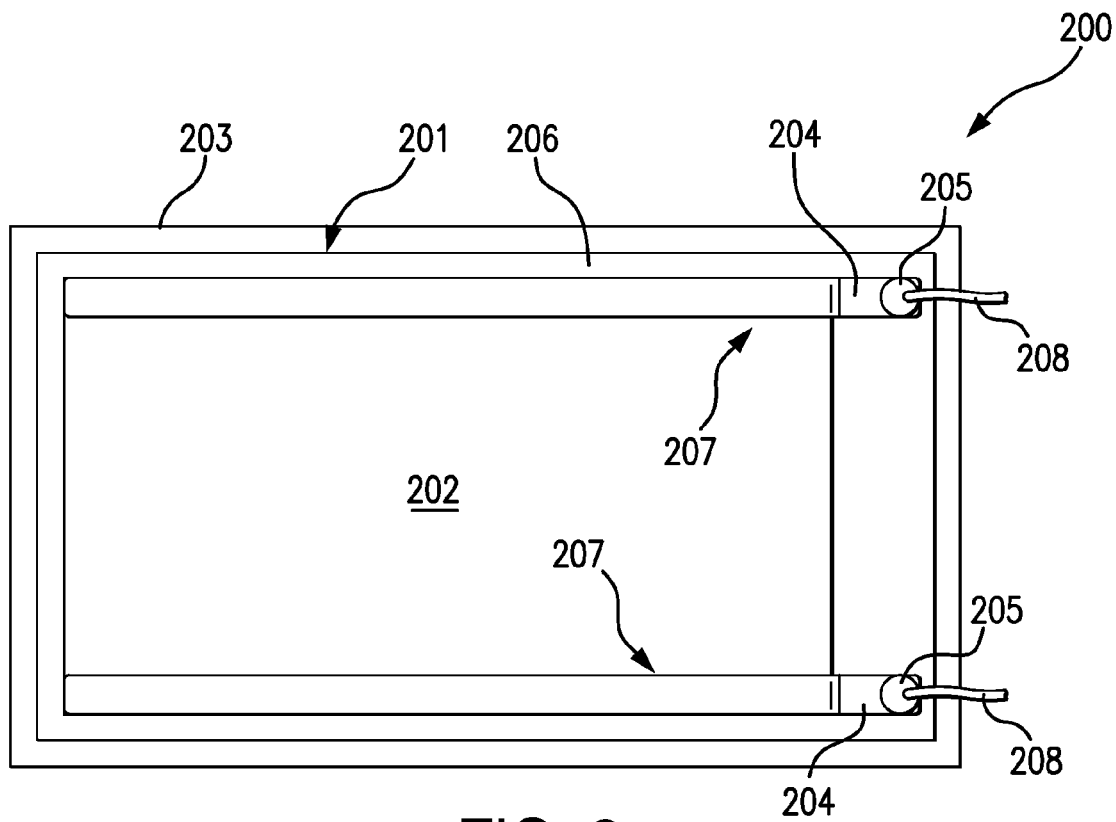
FIG. 3 is a top plan view of the screen printed conductive ink circuit of FIG. 1, schematically showing the conductive ink circuit with the bus bar on an aircraft heated floor panel.

As shown schematically in FIG. 3, an aircraft heated floor panel 200 includes at least one floor panel 203 of an aircraft. Floor panel 203 includes a conductive circuit 201 having a conductive ink 202 including copper bus bars 204 directly written onto areas of a desired electrical connection 207 of conductive ink 202, as described above. Conductive ink 202 is screen printed onto a dielectric film 206 to create conductive circuit 201. Solder 205 connects a wire 208 onto each respective copper bus bar 204 to electrically connect each wire 208 and conductive circuit 201. Those skilled in the art will readily appreciate that conductive ink 202 can include silver particles in an epoxy resin on dielectric film 206.

Figure 4:
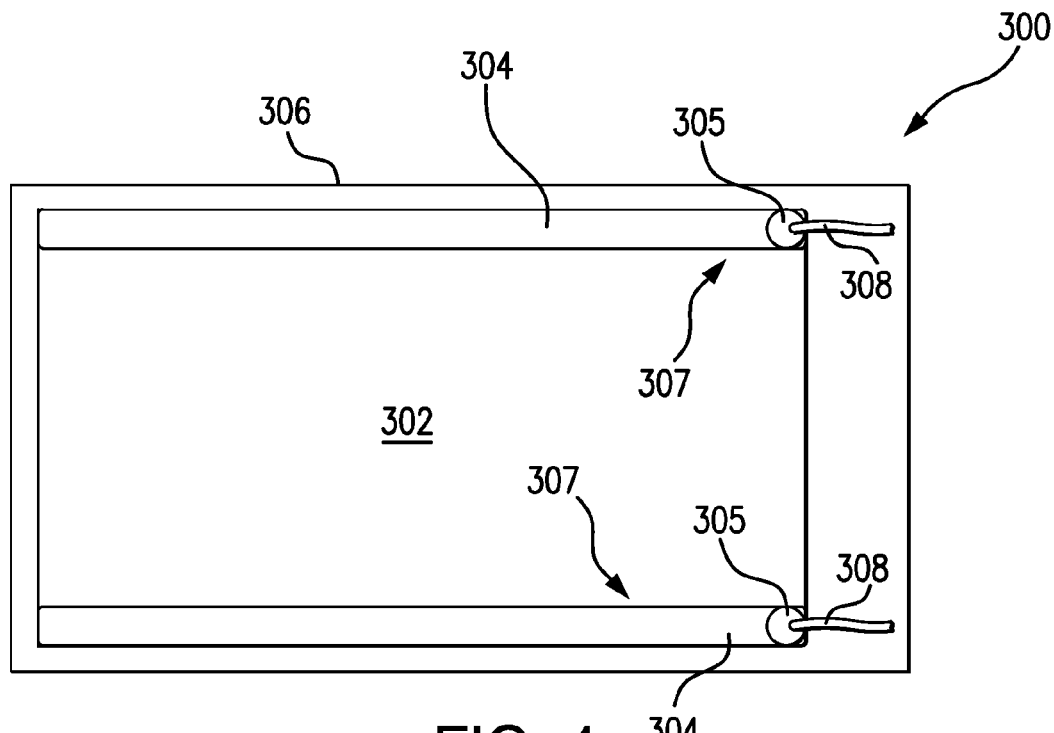
FIG. 4 is a top plan view of an exemplary embodiment of a screen printed conductive ink circuit constructed in accordance with the present disclosure, schematically showing the bus bar, conductive ink, and soldered wire connection.
Figure 5:
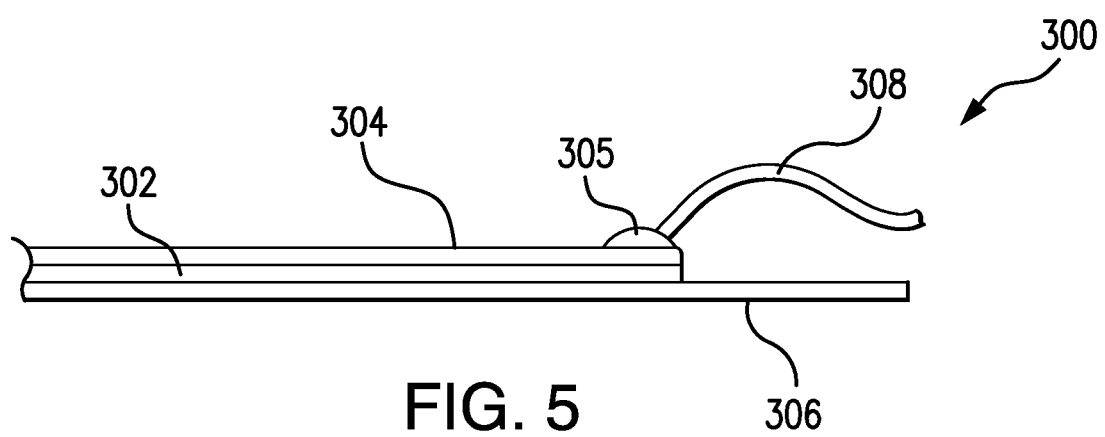
FIG. 5 is a partial side elevation view of the screen printed conductive ink circuit of FIG. 4, schematically showing the bus bar, conductive ink and soldered wire connection.

As shown schematically in FIGS. 4 and 5, a conductive ink circuit 300 includes conductive ink 302 and copper bus bars 304. Conductive ink circuit 300 is substantially similar to conductive ink circuit 100 except that copper bus bars 304 are only applied to conductive ink 302, instead of conductive ink 302 and dielectric film 306. Those skilled in the art will readily appreciate that applying copper bus bars 304 only to conductive ink 302 can tend to save space in compact applications. For example, in applications where there may be multiple conductive ink circuits 300 and/or multiple copper bus bars 304.

A method for soldering an electrical connection onto a conductive ink, e.g. conductive ink 102, 202 or 302, includes direct writing alloy and/or metal bus bars, e.g. copper bus bars 104, 204 or 304, onto areas of a desired electrical connection, e.g. desired electrical connection areas 107, 207 or 307, of the conductive ink. The step of direct writing includes forming a conformal layer of the copper bus bars on the conductive ink. Those skilled in the art will readily appreciate that the conductive ink can include silver particles in an epoxy resin. Further, the method for soldering an electrical connection onto the conductive ink can include soldering a wire, e.g. wire 108, 208 or 308, to each respective copper bus bar to electrically connect the wires to the conductive ink. Those skilled in the art will also readily appreciate that the method for soldering an electrical connection onto the conductive ink can also include applying a conductive circuit, e.g. conductive circuit 100, 200 or 300, to at least one panel skin of an aircraft floor panel, e.g. floor panel 203, described above.

Those skilled in the art will readily appreciate that Meso-Plasma™ thermal spray, available from MesoScribe Technologies, Inc., 7 Flowerfield, Suite 28, St. James, N.Y. can be used to direct write alloy and/or metal bus bars, e.g. copper bus bars 104, 204 or 304, on wire connection areas, e.g. desired electrical connection areas 107, 207 or 307, of conductive ink circuits, e.g. conductive ink circuits 100, 200 or 300, for wire connections. Those skilled in the art will readily appreciate that that MesoPlasma™ thermal spray can write alloy and/or metal traces, e.g. copper bus bars 104, 204 or 304, on plastic without adhesives and no curing is required, reducing labor time and cost as compared to traditional conductive ink circuits. It is contemplated that any other suitable direct write technology can also be used to direct write metal bus bars, e.g. copper bus bars, on wire connection areas, for example, Aerosol Jet® printing, available from Optomec, Inc. Corporation, 3911 Singer Boulevard, N.E. Albuquerque, N. Mex., can be used.

The methods and systems of the present disclosure, as described above and shown in the drawings, provide for conductive ink circuits with copper bus bars with superior properties including ease of manufacturing. While the systems and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A method for providing an electrical connection for conductive ink, the method comprising:
   direct writing a bus bar onto areas of a desired electrical connection of the conductive ink, wherein the conductive ink is screen printed onto a dielectric film to create a conductive circuit, wherein the step of direct writing further includes forming a conformal layer of the bus bar on the conductive ink, and wherein forming the conformal layer of the bus bar on the conductive ink includes forming the conformal layer on a top surface, an edge and a side surface of the conductive ink.

2. A method as recited in claim 1, further including soldering a wire to the bus bar to electrically connect the wire to the conductive ink.

3. A method as recited in claim 1, wherein the conductive ink includes silver particles in an epoxy resin.

4. A method as recited in claim 1, further including applying the conductive circuit to at least one panel skin of an aircraft floor panel.

5. A method as recited in claim 1, wherein the bus bar is a metal bus bar.

6. A method as recited in claim 5, wherein the metal bus bar is a copper bus bar.

7. A method as recited in claim 1, wherein the bus bar is an alloy bus bar.

8. A heated floor panel comprising:
   at least one floor panel of an aircraft including a conductive circuit having a conductive ink including a bus bar directly written onto areas of a desired electrical connection for the conductive ink, wherein the conductive ink is screen printed onto a dielectric film to create a conductive circuit, wherein the bus bar is a conformal layer of bus bar on the conductive ink that conforms to a top surface, an edge and a side surface of the conductive ink.

9. A heated floor panel as recited in claim 8, wherein a wire is soldered onto the bus bar to electrically connect the wire and the conductive circuit.

10. A heated floor panel as recited in claim 8, wherein the conductive ink includes silver particles in an epoxy resin.

11. A heated floor panel as recited in claim 8, wherein the bus bar is a metal bus bar.

12. A heated floor panel as recited in claim 11, wherein the metal bus bar is a copper bus bar.

13. A heated floor panel as recited in claim 8, wherein the bus bar is an alloy bus bar.

* * * * *